United States Patent [19]

Matsuura et al.

[11] Patent Number: 4,566,795
[45] Date of Patent: Jan. 28, 1986

[54] ALIGNMENT APPARATUS

[75] Inventors: Toshio Matsuura, Koshigaya; Kyoichi Suwa, Kawasaki, both of Japan

[73] Assignee: Nippon Kogaku K. K., Tokyo, Japan

[21] Appl. No.: 586,639

[22] Filed: Mar. 6, 1984

Related U.S. Application Data

[63] Continuation of Ser. No. 348,716, Feb. 16, 1982, abandoned.

[30] Foreign Application Priority Data

Feb. 20, 1981 [JP]  Japan .................................. 56-22951

[51] Int. Cl.$^4$ ............................................. G01B 11/27
[52] U.S. Cl. ..................................... 356/400; 356/401
[58] Field of Search ............... 356/399, 400, 401, 150; 250/548, 557

[56] References Cited

U.S. PATENT DOCUMENTS

| | | | |
|---|---|---|---|
| 4,127,777 | 11/1978 | Binder | 356/400 |
| 4,153,371 | 5/1979 | Koizumi et al. | 356/401 |
| 4,251,129 | 2/1981 | Suzki et al. | 356/401 |
| 4,277,178 | 7/1981 | Cushing et al. | 356/431 |
| 4,362,389 | 12/1982 | Koizumi et al. | 356/401 |
| 4,390,279 | 6/1983 | Suwa | 356/401 |
| 4,406,546 | 9/1983 | Suzuki | 356/400 |
| 4,408,885 | 10/1983 | Johannsmeier et al. | 356/401 |
| 4,423,959 | 1/1984 | Nabozawa et al. | 356/401 |

Primary Examiner—R. A. Rosenberger
Attorney, Agent, or Firm—Shapiro and Shapiro

[57] ABSTRACT

An alignment apparatus for aligning one of the substrates with the other by means of first and second reference marks comprises scanning means including a light beam generating means for reciprocally scanning first and second areas respectively by a light beam, discrimination means for generating a discrimination signal indicative of the scanning direction by the scanning means in synchronism with the scanning, first photoelectric means for generating a first signal when the first photoelectric means receives the light beam transmitted through a first area and separated by the first reference mark, second photoelectric means for generating a second signal when the second photoelectric means receives the light beam transmitted through the second area and separated by the second reference mark, operation means for determining the direction and amount of the relative deviation between the first and second reference marks from the first and second signals and from the discrimination signal, and means for moving one of the substrates relative to the other in response to the operation means. The alignment apparatus is simple in structure and can detect alignment marks with higher accuracy. The alignment apparatus enables the alignment of a wafer with a reticle or mask at higher speed and with higher preciseness.

4 Claims, 49 Drawing Figures

FIG. IA
PRIOR ART
FIG. IB
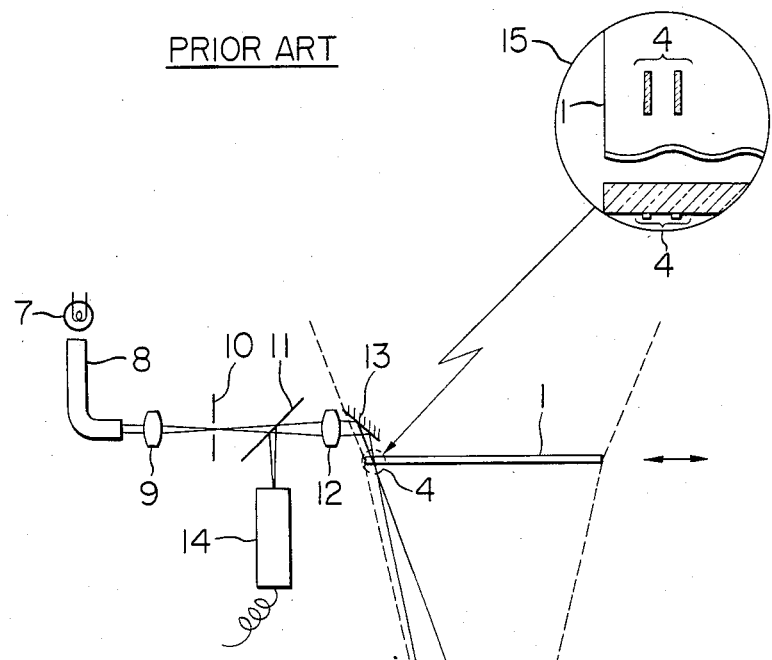
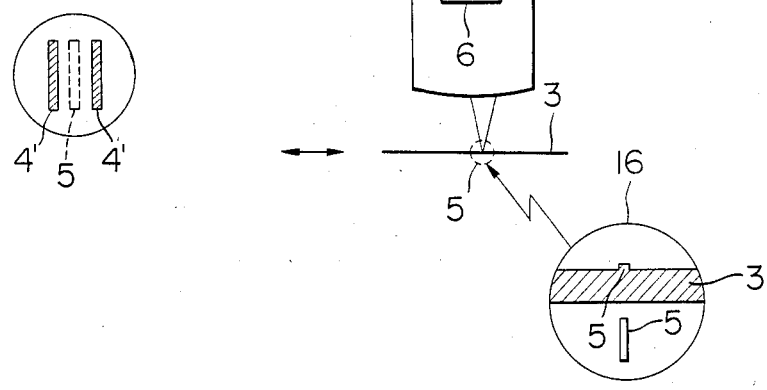

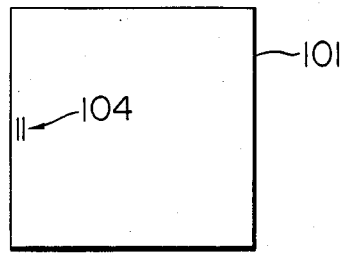
FIG. 2B
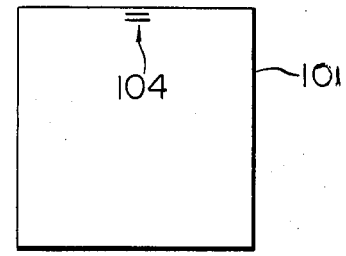
FIG. 3B
FIG. 2A
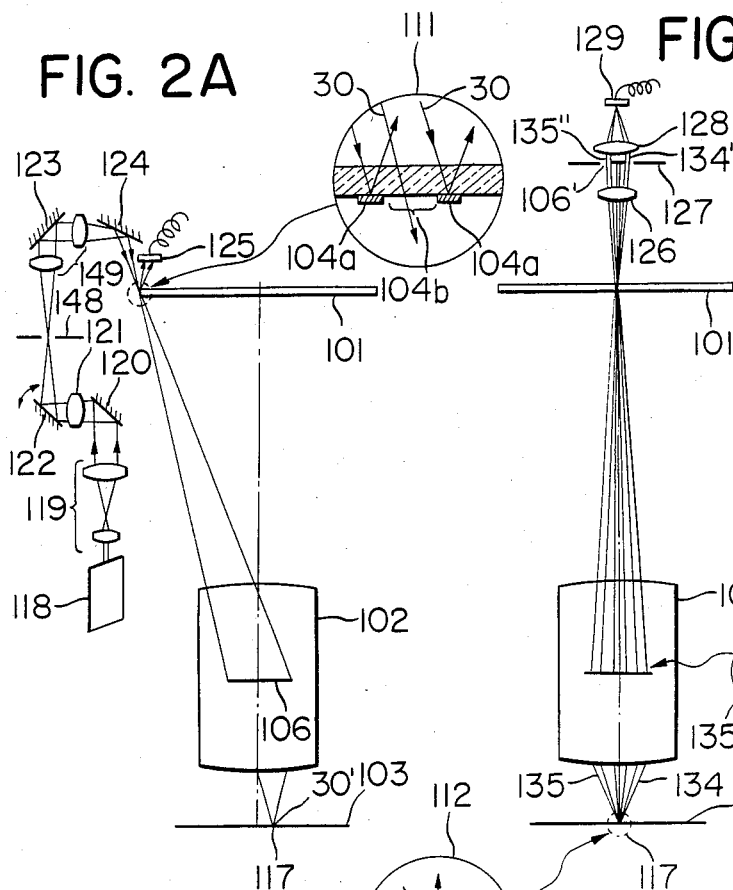
FIG. 3A
FIG. 2C
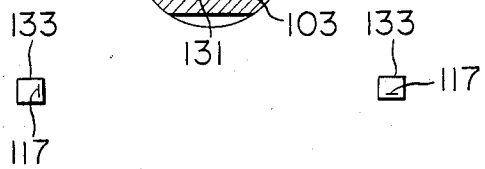
FIG. 3C

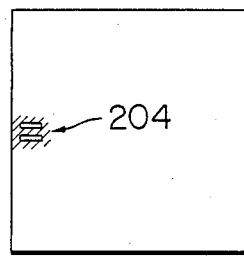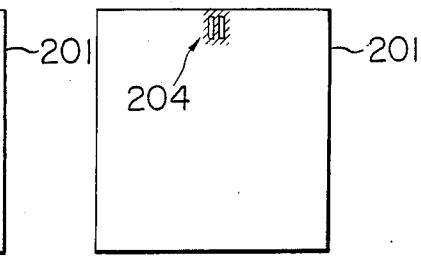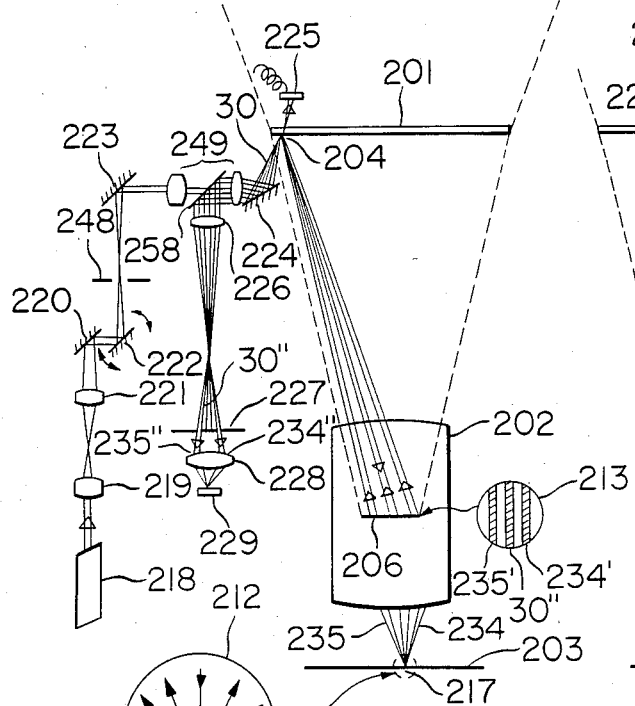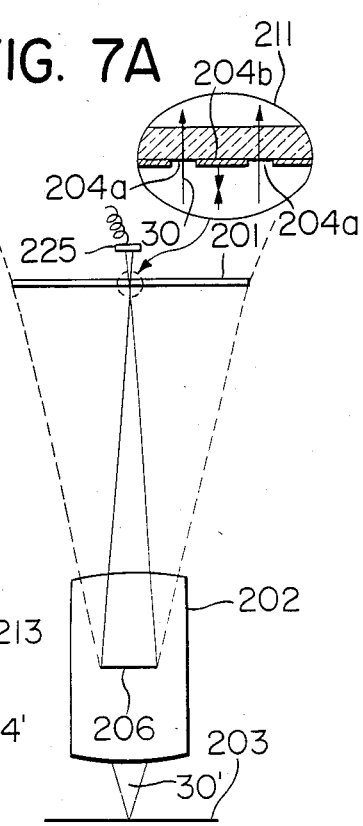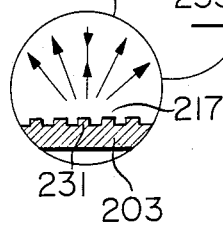

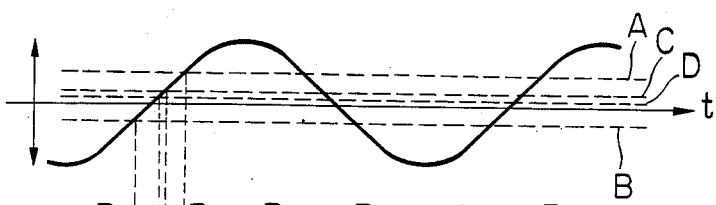
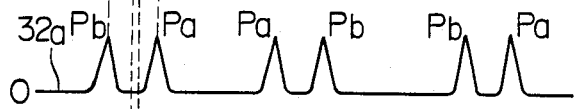
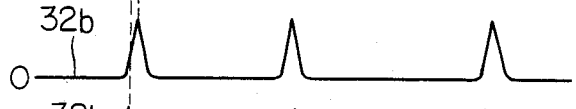
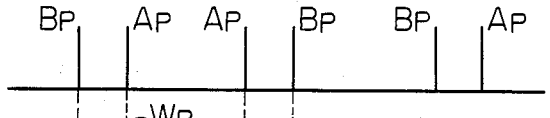
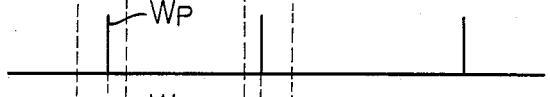
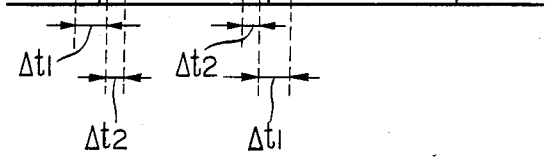
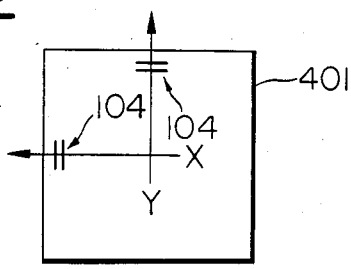

FIG. 13
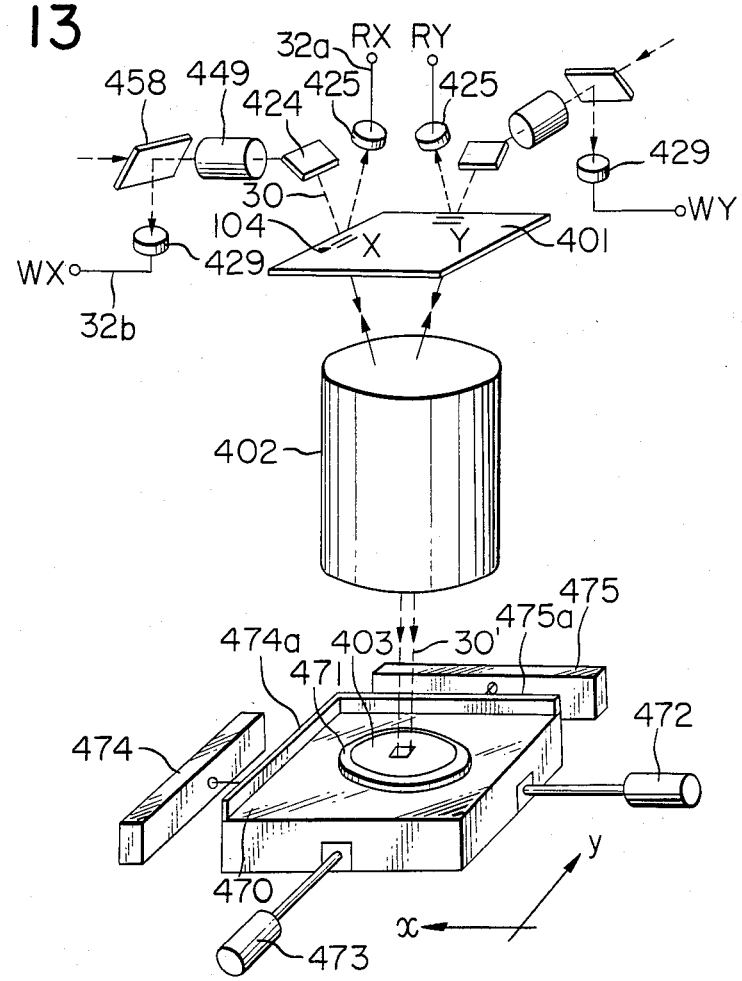
| FIG. 15A | OSCILLATING MIRROR DRIVING SIGNAL |
| FIG. 15B | OUTPUT OF DETECTOR 482 |
| FIG. 15C | OUTPUT OF DETECTOR 483 |
| FIG. 15D | SIGNAL S3 |
| FIG. 15E | SIGNAL S1 |
| FIG. 15F | SIGNAL S2 |
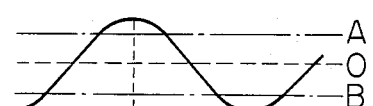

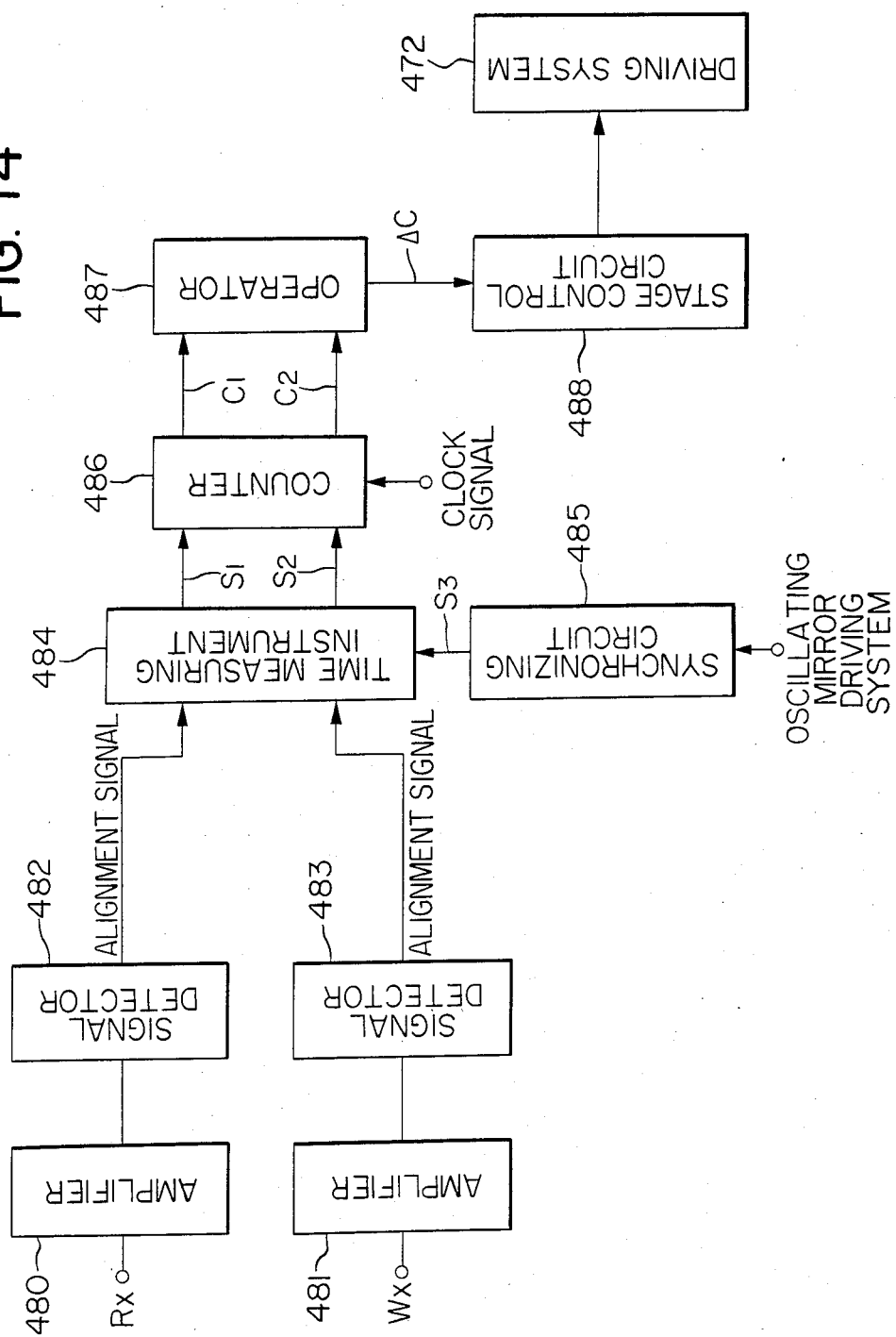

FIG. 16A
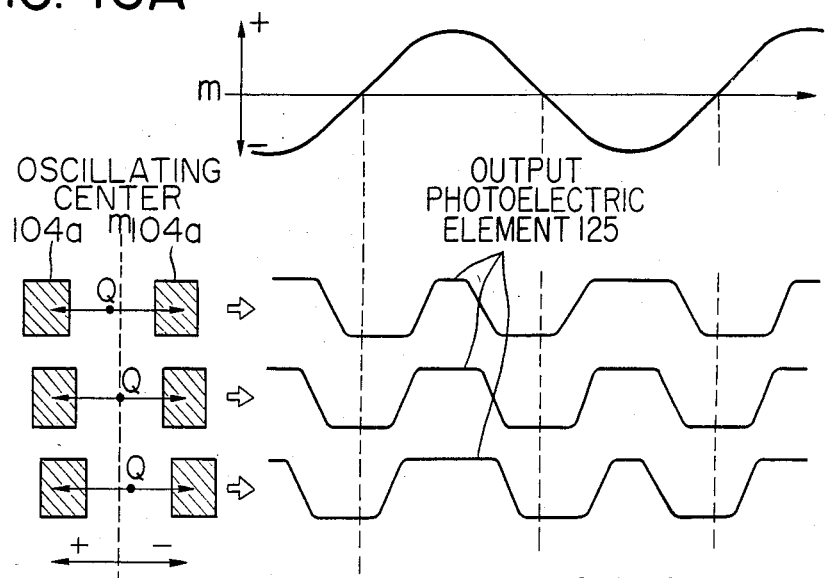

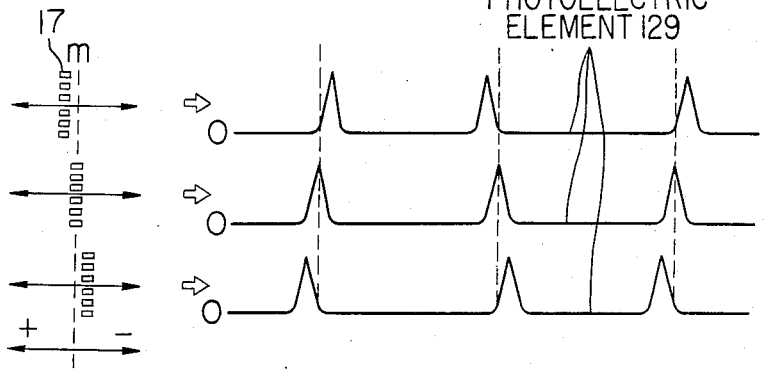
FIG. 16E
FIG. 16F
FIG. 16G
FIG. 16H
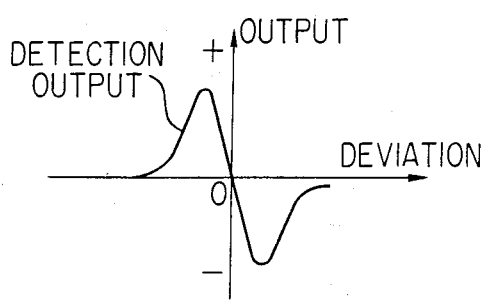

ALIGNMENT APPARATUS

This is a continuation application of Ser. No. 348,716, filed Feb. 16, 1982, now abandoned.

BACKGROUND OF THE INVENTION

1. Field of the Invention

The present invention relates to an alignment apparatus in IC (integrated circuit) exposure apparatus. More particularly the present invention relates to such alignment apparatus operable according to the known TTL (Through The Lens) system in which the relative position of a mask to a wafer is observed through a projection optical system in a projection exposure apparatus for projecting the mask pattern on the wafer.

2. Description of the Prior Art

According to the known projection exposure method for manufacture of highly integrated circuits such as LSI and VLSI by a printing apparatus provided with an optical lens, a mask pattern is generally projected on a wafer through an image-forming projection lens. In particular when there is used such projection exposure apparatus with which a mask pattern is projected on a wafer at a minifying power in the order of ×1/10, the same pattern is projected on one and the same wafer many times repeatedly. For this purpose it is desirable that the operator should examine the state of alignment of the mask with the wafer every time of printing on each chip while observing the relative position of the mask to the wafer through the projection lens (according to TTL system). This alignment is commonly called step-alignment or each-alignment in the art.

With the rapid development of the technique concerning IC in these years, the line width of pattern on the wafer has become thinner and thinner. Now, it is not seldom that the line width is 1 μm or less. With this tendency it has been required to improve the accuracy of step-alignment and increase the speed of the alignment. There is an increasing desire for automation of alignment. Realization of automatic alignment is desired also in order to lessen the fatigue of operators in such alignment work.

As TTL automatic step-alignment there has already been known and used such alignment method according to which a wafer alignment mark image and a reticle alignment mark image are scanned by use of ITV camera or slitwise and photo-electrically converted to detect the relative position of the wafer to the reticle.

An example of TTL automatic alignment apparatus using IVT camera according to the prior art is shown in FIG. 1A for purpose of illustration.

In IC exposure apparatus, a pattern on the reticle 1 is printed on the wafer 3 through a minifying projection lens 2. To carry out TTL automatic step-alignment, an image of alignment mark 4 on the reticle 1 and an image of alignment mark 5 on the wafer 3 have to be formed again on the light reception surface of an ITV camera 14. In this connection it is to be understood that an image of the mark 5 has once been formed on the reticle 1 through the projection lens 2.

An alignment mark image 4′ of the reticle and an alignment mark image 5′ of the wafer formed on the light reception surface of ITV camera 14 in this manner are shown in FIG. 1B. These alignment mark images are scanned by TV scanning lines to produce photoelectric signals by means of which the relative position of the reticle 1 to the wafer 3 is detected. Relying on the result of the detection, the reticle 1 or wafer 3 is moved to a determined relative position in which the reticle 1 and the wafer (chip) get in alignment with each other.

Light source 7, optical waveguide 8, condenser lens 9, field stop 10, half-mirror 11, objective lens 12 for alignment mark and mirror 13 constitute together an illumination system.

The above shown apparatus according to the prior art has some drawbacks.

The contrast of alignment marks obtainable in such prior art apparatus is too low to measure the alignment marks without difficulty.

For example, when an alignment mark of $SiO_2$ is provided on a wafer of Si, the contrast between the mark and the wafer is very low because Si and $SiO_2$ have substantially the same total reflection power. The photoelectrical signal produced from ITV is an intensity signal corresponding to the contrast then obtained. Therefore, in this case, there is a possibility that it is difficult to detect the alignment mark.

In addition, when alignment has to be carried out by means of such signal having very low S/N ratio, the accuracy of alignment can be increased up only by a long signal processing operation for integrating the signals. As a long time is required for this signal processing, the speed of alignment is reduced accordingly.

Another drawback of the prior art apparatus is found in that the form of signals is not constant and it is greatly affected by the state in which the alignment mark 5 is formed on the wafer and by the condition of the photo resist coating applied thereon. For example, the resist coating often brings about such objectionable phenomenon where the alignment mark image formed on the image-forming surface appears as a dark line or a bright line or dark and bright are inverted at the edge portion of the mark due to the interference by the resist.

Due to the above drawbacks, the prior art apparatus involves difficulty and complication in correctly discerning the alignment mark and detecting its position.

SUMMARY OF THE INVENTION

Accordingly, it is an object of the present invention to provide an alignment apparatus which is simple in structure and correctly detects alignment marks and which enables the alignment of the wafer with the reticle or mask at high speed and with improved accuracy.

To attain the foregoing object according to the invention there is provided an alignment apparatus for use with apparatus in which a first substrate provided with a pattern and a first area having a first reference mark and a second substrate provided with a second area having a second reference mark are disposed optically conjugated with each other relative to an image-forming optical system and an image of said pattern is formed on the second substrate through said image-forming optical system from a beam of exposure light projected on said pattern on the first substrate, the improvements directed to the alignment apparatus for aligning one of the substrates with the other by means of said first and second reference marks comprising:

(a) scanning means including a light beam generating means for reciprocally scanning said first and second areas respectively by said light beam, said scanning means being so disposed as to make the light beam transmitted through said first area pass through said image-forming optical system and then enter said second area;

(b) discrimination means for generating a discrimination signal indicative of the scanning direction by said scanning means in synchronism with the scanning;

(c) first photoelectric means for generating a first signal when said first photoelectric means receives the light beam transmitted through said first area and separated by said first reference mark;

(d) second photoelectric means for generating a second signal when said second photoelectric means receives the light beam transmitted through said second area and separated by said second reference mark;

(e) operation means for determining the direction and amount of the relative deviation between said first and second reference marks from the first and second signals and from the discrimination signal; and (f) means for moving one of the first and second substrates relative to the other in response to said operation means.

Other and further objects, features and advantages of the invention will appear more fully from the following description.

BRIEF DESCRIPTION OF THE DRAWINGS

FIG. 1 shows an alignment apparatus according to the prior art in which FIG. 1A is an illustration of the optical system thereof and FIG. 1B is an illustration of the mark images observed through ITV camera;

FIGS. 2 and 3 show the optical system of a first embodiment of the alignment apparatus according to the present invention in which FIG. 2A is a front view of the apparatus, FIG. 2B is a plan view of the reticle in FIG. 2A, FIG. 2C is a plan view of a chip on the wafer in FIG. 2A, FIG. 3A is a side view of the apparatus shown in FIG. 2A, FIG. 3B is a plan view of the reticle in FIG. 3A and FIG. 3C is a plan view of the chip on the wafer in FIG. 3A;

FIGS. 6 and 7 show the optical system of a second embodiment of the alignment apparatus according to the invention in which FIG. 6A is a front view of the apparatus, FIGS. 6B and 6C are plan views of the reticle and a chip on the wafer in FIG. 6A respectively, FIG. 7A is a side view of the apparatus, FIGS. 7B and 7C are plan views of the reticle and the chip on the wafer in FIG. 7A;

FIG. 9 shows the optical system of a third embodiment of the alignment apparatus according to the invention in which

FIG. 11 illustrates the matter of signal processing for detecting the position of the alignment mark, which is common to all the embodiments and in which FIG. 11A shows the scanning waveform of laser beam, FIGS. 11B to 11D are waveform charts showing the output signals from the respective photoelectric elements and FIGS. 11E to 11G are waveform charts of the binary signals obtained by converting the output signals in FIGS. 11B to 11D, respectively;

FIG. 12 is a plan view of a reticle used in a fourth embodiment of the invention;

FIG. 13 is a perspective view of the fourth embodiment;

FIG. 14 is a block diagram of the processing system for controlling the apparatus shown in FIG. 13;

FIG. 15 is a timing chart of the respective signals in the processing system shown in FIG. 14;

FIG. 16 illustrates the manner of alignment mark detection according to the synchronous detection method in which FIG. 16A shows the scanning waveform of spotlight, FIGS. 16E to 16G show the relation between the oscillation of spotlight and the wafer mark and the waveforms of the respective photoelectric signals and FIG. 16H is a graph showing the detection output;

DESCRIPTION OF THE PREFERRED EMBODIMENTS

Figure 4:
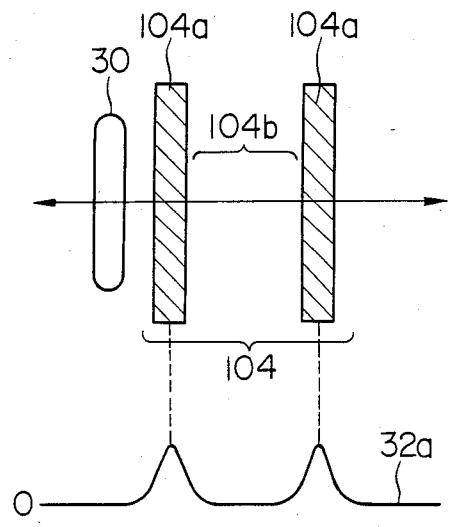
FIG. 4 shows the photoelectric signal derived from the reticle mark shown in FIGS. 2 and 3.

In general, in order to obtain a high resolving power, the projection lens used in IC projection exposure apparatus is so designed as to eliminate aberrations such as color aberration and spherical aberration exclusively to one or two particularly selected wavelengths. This particularly selected wavelength is that used for exposure. Therefore, in the following embodiments, a particularly selected wavelength of light which is not affected by the color aberration, spherical aberration etc. of the projection lens is used as the alignment light. In the particular embodiments described hereinafter, there is used g-line of mercury lamp as the exposure light source. Therefore, the projection lens used in the following embodiments is a lens from which aberration to g-line have been eliminated. As the illumination light source for detecting the alignment position there is used a He-Cd laser. The oscillation wavelength of He-Cd laser is 441.6 nm. This wavelength is nearly equal to the wavelength of g-line which is 436 nm. Therefore, the adverse effect of aberrations on the used light can be eliminated. The use of laser light has another advantage that a spotlight in any desired form and having a high luminance can be obtained easily as the scanning light on the reticle surface and the wafer surface. In the following embodiments, a spotlight in the form of an elongated slit is used as the scanning light.

FIGS. 2A and 3A show the optical system of an alignment apparatus as the first embodiment of the present invention.

A g-line exposure light source not shown is provided above the reticle 101. A pattern on the reticle 101 is minified through a projection lens 102 and projected on a wafer 103. This arrangement is the same as that of the prior art apparatus. As seen best in FIGS. 2B and 3B, an alignment mark 104 is proved at the marginal portion of the reticle 101 to detect the relative position of the reticle 101 to a chip 133 on the wafer 103. The structure of the alignment mark 104 is shown in a circle 111 in FIG. 2A. The alignment mark 104 is composed of two narrow slit-like chrome layers 104a and a center portion 104b between the two chrome layers. On the center portion 104b there is applied no chrome layer so that the scanning light for an alignment mark on the wafer and diffracted light (return light) can pass through the center portion 104b.

The alignment mark on the wafer is designated by 117. This wafer alignment mark 117 is provided for every chip 133 on the wafer 103 as shown in FIGS. 2C and 3C. The mark 117 is formed by printing, for example, at the time of the first exposure printing on the wafer. Since the reticle 101 and the wafer 103 are optically conjugated to each other with respect to the projection lens 102, an image of the alignment mark 117 on the chip 133 is formed on the center portion 104b of the mark 104.

The above described marks 104 and 117 are detected by scanning of the above mentioned He-Cd laser light. A beam of light emitted from the He-Cd laser light source 118 is directed to a beam scanning oscillating mirror 122 through collimator lens system 119, 121 and stationary mirror 120. The cross-section of the laser beam is elongated into a strip-like shape. The oscillating mirror 122 oscillates about an axis intersecting the plane of the drawing at right angles and scans the laser beam. The scanned laser beam is guided to an area in the vicinity of the mark 104 on the reticle 101 from above through field stop 148, objective lens system 149 and mirrors 123 and 124. The field stop 148 serves to restrict the scanning range. The laser beam, when it reaches the reticle, becomes a spotlight 30 elongated in the direction intersecting the scanning direction of the oscillating mirror 122 approximately at right angles. At the same time, the spotlight 30 is elongated in the same direction as the length of the narrow chrome layers 104a of the mark 104. Thus, as shown in the circle 111, the spotlight 30 scans the surface of the mark 104. When the spotlight 30 falls on the surface of the chrome layer 104a, almost all of the rays of the spotlight are reflected by it. However, when it falls upon the center portion 104b of the mask, the spotlight 30 is transmitted to the wafer 103 through the projection lens 102. The light reflected upon the surface of the chrome layer 104a is detected photoelectrically by a photoelectric element 125 provided above the reticle 101 (on the exposure light source side). On the contrary, the spotlight 30 passing through the center portion 104b is minified by the projection lens 102 and then projected on the wafer 103 to scan the mark 117. This spotlight is designated by 30'.

The alignment mark 117 on the wafer 107 is so formed as to comprise a plural number of minute line segment elements arranged in a line along the length of the elongate spotlight 30'. In other words, the alignment mark 117 is so formed as to form a kind of diffraction grating. By this particular structure of the mark 117 there is produced a diffracted light from the mark when the spotlight 30' falls upon the mark 117. This will be described further with reference to FIG. 3A.

The cross-section of the mark 117 is shown within a circle 112 in FIG. 3A. A number of minute line segments 131 are arranged in a line along the length of the elongate spotlight 30'. These line segments 131 constitutes the alignment mark 117. Since the projection lens is telecentric on the image side (wafer side), the light reflected upon the wafer surface returns back along the same optical path as that along which the spotlight has once travelled toward the wafer. Therefore, the normal-reflected light by the mark 117 passes through the projection lens 102 and then forms an image in the center portion 104b of the mark 104 on the reticle. Furthermore, among the diffracted rays by the mark 117, those refracted rays which pass through the projection lens 102 can form an image also in the center portion 104b of the mark 104 on the reticle. As an example, let the numerical aperture of the projection lens be N.A.=0.35, the grating period of the mark 117 be 4 nm and the wavelength of the scanning laser beam be 441.6 nm. Then, those diffracted rays which are in zero-order (normal-reflected light), ± primary order, ± secondary order and ± tertiary order will return back to the projection lens 102. At the area where no mark exists, on the other hand, only the total-reflected light, that is, the zero-order light will return back to the projection lens 102. The diffracted light appearing on the pupil 106 of the projection lens 102 is illustrated within a circle 113 in FIG. 3A. As seen from it, positive and negative higher order diffracted lights 134' and 135' appear at the positions distant from the zero-order light 30''. In this manner, some diffracted lights can reach the center portion 104b of the mark 104 on the reticle 101. After passing through the reticle 101, the diffracted light is incident on the mirror 124 shown in FIG. 2A. After reflected by the mirror 124, the return light travels toward the laser light source 118 along the optical path shown in FIG. 2A. By inserting a half mirror or the like (not shown) in the optical path extending from the mirror 120 to the mirror 124 through the field stop 148, therefore, it is possible to make only the diffracted light branched exclusively. As shown in FIG. 3A, an image-forming objective lens 126 is provided to such branched diffracted light. Through the objective lens 126, the branched diffracted light forms an image 106' of the pupil 106 of the projection lens 102. On the focal plane on which the image 106' is formed, there is provided a filter 127 which cuts off the zero-order light exclusively among the diffracted rays of light. Other diffracted lights of higher order than the zero-order are concentrated by a condenser lens 128 and then enter a photoelectric element 129.

Figure 5:
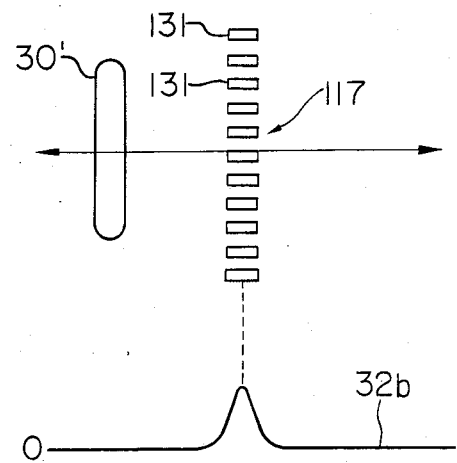
FIG. 5 shows the photoelectric signal derived from the wafer mark shown in FIGS. 2 and 3.

With the above described arrangement, a photoelectric signal as shown in FIG. 4 is obtained from the photoelectric element 125 which receives the light reflected upon the chrome layers 104a of the mark 104 on the reticle. Also, a photoelectric signal as shown in FIG. 5 is obtained from the photoelectric element 129 which receives the higher order diffracted lights by the mark 117 on the wafer.

Referring to FIG. 4, the spotlight 30 scans the surface of the mark 104 in the direction of arrow. During the scanning, the photoelectric element 125 produces a signal 32a having two peaks corresponding to the two chrome layers 104a. Therefore, the center position between the two chrome layers 104a can be found out correctly by detecting the two peaks of the signal 32a. Even when the chrome layers 104a have a low reflective chrome surface, a similar signal can be obtained. There is no problem of insufficient reflected light, that is, insufficient incident light on the photoelectric element 125.

As previously described, the spotlight 30 is transmitted through the reticle 101 and reaches the wafer where the spotlight becomes the spotlight 30' which scans the surface of the mark 117 on the wafer. As previously noted and clearly seen from FIG. 5, the mark 117 is an array of a number of elements 131 each being in the form of a minute line segment. These small elements 131 are arranged in a row in the direction substantially parallel to the length of the elongate spotlight 30' which is scanned in the direction indicated by arrow in FIG. 5.

When the spotlight 30' scans the mark 117 on the wafer, the photoelectric element 129 produces a signal 32b. Since, as previously noted, the photoelectric element 129 receives primary and higher order diffracted lights, the signal produced from the photoelectric element has a very good ratio of S/N. The center position of the mark 117 can be found out accurately by detecting the peak point of the signal 32b. The aimed alignment of the chip 133 (or wafer 103) to the reticle 101 is attained by registering the mark 117 to the center of the mark 104, namely the middle of the center portion 104b of the mark 104 exactly and finally. In this manner, the alignment can be made in the direction perpendicular to the line of the alignment marks on the reticle and wafer.

At the time of exposure on the wafer 103, a part of the optical system for alignment, for example, the mirror 124 and the photoelectric element 125 can be retracted out of the exposure area.

FIGS. 6 and 7 shows a second embodiment of the invention.

The arrangement of the optical system of this second embodiment is different from that of the above first embodiment mainly in the point that the laser spotlight for scanning the marks on the reticle and the wafer is projected from the underside of the reticle (from the projection lens side). Another difference between the first and second embodiments is found in the shape of the mark provided on the reticle.

The form of the mark 204 provided on the reticle 201 in the second embodiment is shown in FIGS. 6B and 7B. The structure of the mark 204 is shown in detail within a circle 211 in FIG. 7A. As seen from it, the mark 204 comprises two narrow slit-like light transmissive portions 204a (on which no chrome layer is applied) and a chrome layer 204b between the two light transmissive portions 204a. The scanning light toward the mark on the wafer and the diffracted light (return light) from the mark are reflected by the surface of the chrome layer 204b. The mark on the wafer will be described in detail later. The direction in which the mark 204 on the reticle extends is perpendicular to the side line of the reticle 201, which is different from the case of the first embodiment.

The mark provided on the wafer 203 (chip 233) is designated by 217. Like that in the first embodiment, the mark 217 is formed as an array of a number of minute line segment elements 231 as shown in a circle 212 in FIG. 6A. But, the direction in which the elements are arranged in a row in this embodiment is the same as the direction of line of the mark 204 on the reticle.

The mark 204 is scanned by an elongate slit-like spotlight 30 in the same manner as in the first embodiment. The spotlight 30 is directed to a beam scanning oscillating mirror 222 from He-Cd laser light source 218 through collimator lens system 219, 221 and stationary mirror 220. The oscillating mirror 222 oscillates rotating about the rotation axis intersecting the plane of the drawing at right angles although the rotation axis is shown somewhat inclined relative to the plane of the paper for purpose of illustration. The scanned laser beam passes through a field stop 248 disposed optically conjugated with the reticle 201 (or wafer 203). After passing through the field stop 248, the laser beam is guided to the vicinity of the mark 204 on the reticle 201 obliquely from the side under the reticle through mirror 223, objective lens system for reticle 249 and mirror 224. On the reticle 201, the laser beam becomes the spotlight 30 and scans the surface in the direction substantially perpendicular to the line direction of the mark 204.

As illustrated in a circle 211 in FIG. 7A, when the spotlight scans the mark 204 and falls on the light transmissive portion 204a thereof, the spotlight 30 passes through the reticle 201 upwards and enters a photoelectric element 225 provided directly above the mark 204. On the contrary, when the spotlight 30 falls on the chrome layer 204b of the mark 204, it is reflected downwards to the projection lens 202 by the chrome layer. Like that in the first embodiment, the spotlight 30 reflected by the chrome layer 204b is projected on the wafer 203 to scan the mark 203 as the spotlight 30'. At the time, there are generated diffracted lights as shown in a circle 213 in FIG. 6A. On the pupil 206 of the projection lens 202, therefore, zero-order diffracted light 30" and primary and higher order diffracted lights 234' and 235' appear in the same manner as in the first embodiment. These diffracted lights are reflected by the chrome layer 204b of the mark 204 and returned back to the scanning optical system for laser beam. These diffracted lights, that is, return light is branched toward a wafer mark detecting optical system by a half mirror 258 provided at a portion of the objective lens system 249.

As previously described in connection with the first embodiment, the diffracted lights in different diffraction orders can be separated one from another easily 10 on the pupil 206 by limiting the numerical aperture of the projected beam in the direction in which the diffraction by the mark 217 on the wafer occurs, that is, by restricting the beam into strip form on the pupil 206 of the projection lens 202. To this end, in this embodiment, there is provided a filter 227 disposed conjugated with the pupil 206 of the projection lens 202. The filter 227 is a filter which cuts off only zero-order diffracted light. The branched diffracted lights from the half mirror 258 are filtered by this filter 227 to separate the primary and higher diffracted lights 234" and 235" from the zero-order light. These separated diffracted lights 234" and 235" are concentrated by a condenser lens 228 and then incident on a photoelectric element 229. A part of the objective lens system 249 and a lens system 226 constitute an optical system for forming an image of the pupil 206 on the filter 227.

Figure 8:
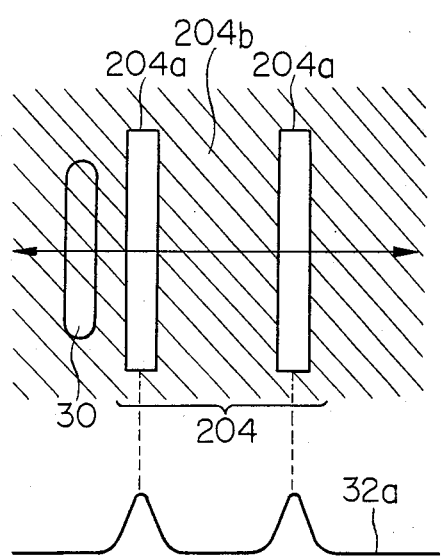
FIG. 8 shows the photoelectric signal derived from the reticle mark in the second embodiment.

In the above described second embodiment, a photoelectric signal as shown in FIG. 8 is obtained from the photoelectric element 225 which receives the spotlight 30 transmitted through the light transmissive portion 204a of the mark 204 on the reticle. In FIG. 8, the arrow indicates the scanning direction of the spotlight 30 on the mark 204. The quantity of transmitted light to the photoelectric element 225 becomes maximum when the spotlight 30 falls on the two light transmissive portions 204a. Therefore, as shown in FIG. 8, the photoelectric signal 32a produced from the photoelectric element 225 has two peaks like that in the first embodiment.

The photoelectric signal obtained from the other photoelectric element 229 and the relation between the signal and the position of the spotlight 30' on the wafer are entirely the same as those in the first embodiment and shown in FIG. 5. Therefore, they need not be further described.

By means of the output signals 32a and 32b from the photoelectric elements 225 and 229 the aimed correct alignment of the chip 233 (wafer 203) with the reticle 201 can be attained while registering the wafer mark 217 to the center of the reticle mark 204, namely the middle of the chrome layer 204b. When the spotlight 30' falls on other area than the mark 217, there is produced only a normal-reflected light, that is, zero-order light. Therefore, at this time, the signal 32b has no peak.

In FIG. 6A, the broken line suggests the area where the wafer exposure light (for example, of g-line wavelength) passes in the second embodiment. As seen from it, since the alignment laser beam is incident on the surface of the reticle 201 obliquely and from the side under the surface, the optical element to be inserted in the exposure area is the photoelectric element 225 only. Generally, for an optical system for alignment, especially strict preciseness in positioning is required. In this sense, the arrangement of the above second embodiment has a particular advantage. It is no longer necessary to move the optical system so long as the position of the mark 204 remains unchanged relative to the reticle 201. The thing necessary is only to retract the photoelectric element 225 into a position out of the exposure area when the wafer 203 is exposed to light for printing. The function of the photoelectric is only to receive the laser light transmitted through the light transmissive portion 204a of the mark 204. Therefore, so high accuracy is not required in positioning the element. Consequently, according to the above second embodiment, it is made possible to repeat the insertion and retraction of the optical element into and from the exposure area at a higher speed than that in the first embodiment.

Figure 9B:
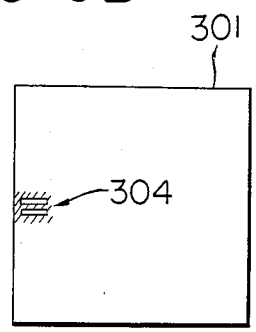
FIG. 9A is a front view of the apparatus and FIG. 9B is a plan view of the reticle in FIG. 9A.

FIG. 9 shows a further arrangement of the optical system of the alignment apparatus as a third embodiment of the invention.

According to the third embodiment, even the photoelectric element 225 which is a single optical element to be located within the exposure area in the above second embodiment can be located outside of the exposure area. To this end, in the third embodiment, the light transmissive portion 204a of the reticle mark 204 shown in the second embodiment is so formed as to have a form of diffraction grating similar to the wafer mark 217 and the diffracted light generated therefrom when the laser spotlight 30 falls on the portion is detected.

Figure 9A:
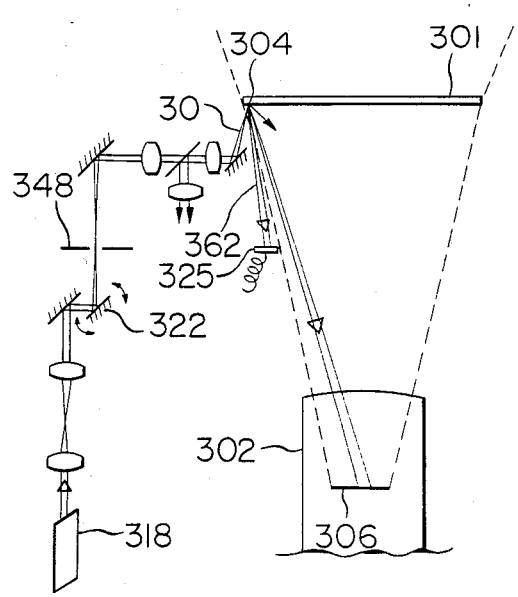
Figure 10:
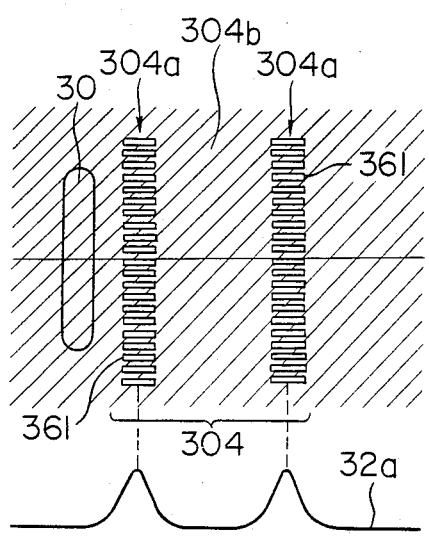
FIG. 10 shows the photoelectric signal derived from the reticle mark in the third embodiment.

Referring to FIG. 9A, the reticle 301 has a mark 304 provided at one side edge of the reticle. The mark 304 is so disposed that its longitudinal direction intersects the side line of the reticle at right angles. The positional relation between the mark 304 and the spotlight 30 as well as the waveform of an photoelectric signal derived therefrom are shown in FIG. 10. Like that in the second embodiment, the spotlight 30 has an elongate slit-like cross-section. The arrow in FIG. 10 indicates the scanning direction of the spotlight 30.

As clearly seen from FIG. 10, the mark 304 is composed of two grating portions 304a in two parallel lines and a chrome layer 304b between the two grating portions. Each of the grating portions 304a comprises a plural number of minute line segment elements 361 disposed parallel to each other and arranged in a row. The chrome layer 304b is the same as that in the above second embodiment. All of the minute line segment elements 361 have no chrome layer applied thereon and therefore they are transmissive to light. Like the second embodiment, the chrome layer 304b reflects the spotlight 30 toward the projection lens 302 and also receives the diffracted lights from the wafer mark to form a return light as described above. The spotlight 30 is projected on the reticle 301 obliquely and from under. When the spotlight falls on the grating portion 304a, there is produced a diffracted light because of the particular form of the portion as a diffraction grating. The quantity of the diffracted light becomes maximum when the spotlight 30 gets completely lapped over the grating portion 304a. Naturally, this diffracted light contains diffracted lights in higher orders than zero. These higher order diffracted lights are generated expanding in the longitudinal direction of the grating portion 304a. Thus, there are produced higher order diffracted lights 362 travelling from the grating portion 304a toward an area outside of the exposure area as shown in FIG. 9A. These diffracted lights 362 are concentrated on a photoelectric element 325 located outside of the exposure area. In this manner, a reticle alignment signal 32a similar to that in the first and second embodiments can be obtained from the photoelectric element 325.

In the arrangement of the optical system according to the third embodiment, no part of the alignment optical system is located within the exposure area. Therefore, it is no longer necessary at all to displace optical elements every exposure time. The operation of exposure to the safer can be started immediately after alignment. Accordingly, the operation speed of the alignment apparatus can be increased up.

The photoelectric element 325 shown in FIG. 9A may be located above the reticle 301 and outside of the exposure area so as to concentrate and receive such higher diffracted lights which run upward from the mark 304 on the reticle 301.

Now, referring to FIG. 11, the manner of signal processing for detecting the position of the alignment marks will be described. The signal processing described hereinafter is common to all of the embodiments described above.

Scanning of the laser beam described in the above embodiments is carried out by driving the oscillating mirror 122, 222 or 322 (which may be, for example, a galvano mirror) by means of sine wave signal. Therefore, the spotlight 30 projected on the reticle and the spotlight 30' on the wafer move in the fashion of sinusoidal oscillation i.e. so-called simple harmonic motion. However, if the amplitude of the oscillation is made sufficiently large and the scanning laser beam is selected from the light in the center portion of the oscillation, then it is possible to perform the scanning approximately linearly relative to time. To this end, a field stop 148, 248 or 348 has been provided in the above embodiments which transmits only the center portion of the scanned laser light. By approximating the scanning to a linear scanning in this manner it is made unnecessary to correct the non-linearity of scanned position to time caused by sinusoidal scanning.

Fig. 11A shows the scanning waveform of the laser light wherein time t is plotted on the abscissa and scanned position on the ordinate. Dotted lines A and B indicate the positions of the two reticle marks (104a, 204a or 304a) relative to the scanning waveform, respectively. Dotted line C indicates the position of the wafer mark (117, 217 or 317) relative to the scanning waveform and dotted line D indicates the position of the center of the two reticle marks relative to the scanning waveform. The aimed alignment of the wafer mark with the center of the reticle mark is attained by moving one of the reticle and wafer relative to the other in such manner that the dotted lines C and D coincide with each other.

FIG. 11B shows the waveform of the output signal 32a from the reticle mark detecting photoelectric element (125 or 225). As previously described, the signal 32a has two peak levels Pa and Pb alternately generated by the sine wave scanning(reciprocation)of the spotlight 30 of the laser beam. FIG. 11C shows the output signal 32b from the wafer mark detecting photoelectric element (129 or 229) when the wafer mark lies in the position of dotted line C. FIG. 11D shows the output signal 32b obtained when the wafer mark lies in the position of the dotted line D.

Signals 32a and 32b are converted into binary signals by a suitable signal processor (which includes, for example, a peak detecting circuit). Binarized signals obtained from the signals 32a and 32b are shown in FIGS. 11E, 11F and 11G respectively. At the two peak points of the signal 32a there are produced digital pulse signals Ap and Bp as seen in FIG. 11E. At the peak point of signal 32b there is produced a digital pulse signal Wp as seen in FIGS. 11F and 11G. These three pulse signals Ap, Bp and Wp obtained in this manner are used as alignment signals.

To exactly detect the position of each alignment mark by means of above pulse signals, the amplitude of laser beam scanning is made sufficiently large and each alignment mark is scanned using such part of sine wave having the highest linearity. By scanning using such part having good linearity, it is possible to proportionally approximate the time delay among the pulse signals Ap, Bp, Wp to the difference in position (distance) between reticle and wafer. Therefore, the relative position between reticle mark and wafer mark can be found out by detecting time $\Delta t_2$ of from pulse signal Ap to Wp and time $\Delta t_1$ of from Bp to Wp. The aimed alignment of wafer with reticle is attained by moving reticle or wafer in the direction for $\Delta t_1 = \Delta t_2$. The pulse signal Wp obtained when $\Delta t_1 = \Delta t_2$ is shown in FIG. 11G.

If the laser beam is oscillated with a sufficiently large amplitude enough to sufficiently broaden the near-linear scanning area, then it is unnecessary to make the oscillating center of beam scan coincident with the center of the reticle mark. The thing necessary is that the area between dotted lines A and B shown in FIG. 11A lies within the near-linear area of the sinusoidal wave.

While only one reticle mark has been provided in each of the above first, second, third embodiments, two or more similar reticle marks may be provided on the marginal portion of the reticle (or on the marginal portion of the area in which a circuit pattern is actually described) to align the wafer with the reticle in two directions. Alignment in two directions is preferable to that in single direction. FIG. 12 shows an arrangement of two reticle marks useful to such two-direction alignment.

In FIG. 12, the reticle 401 has two marks 104 each of which is the same as that used in the first embodiment in shape and structure. One of the two marks is provided at one side of the reticle and the other is at another side. These two marks 104 are disposed in such manner that the direction of line of one mark 104 intersects that of the other mark 104 at right angles. As shown in FIG. 12, alignment is carried out in these two directions intersecting each other, that is, in X-direction and Y-direction on the reticle 401. As a matter of course, the same number of wafer marks extending in the same directions as those on the reticle are also provided at the corresponding positions on the chip of wafer.

An embodiment of the alignment apparatus using two reticle marks and two wafer marks is shown in FIG. 13 as a fourth embodiment of the invention.

Although the optical system used in this fourth embodiment is shown to be the same as that in the first embodiment, it is to be understood that the optical system shown in the second embodiment or third embodiment may be used also in this fourth embodiment.

In FIG. 13, reticle is designated by 401, projection lens by 402 and wafer by 403. The wafer 403 under the projection lens 402 is placed on a stage 470 through a turn table 471. The stage 470 is movable in two directions x and y intersecting each other at right angles. The turn table 471 serves to change the rotation of the wafer 403 relative to the stage 470 within a minute range. The stage 470 is moved in x- and y-direction by the driving systems 472 and 473. The position of the stage 470 is continuously measured by measuring means for x-direction and measuring means for y-direction. In the shown embodiment, said measuring means comprises light wave interferometers 474, 475 and moving mirrors 474a and 475a. The two moving mirrors are provided on the stage 470 intersecting each other at right angles.

As previously mentioned, there are provided on the reticle 401 two reticle marks 104 one of which is hereinafter referred to as X-mark and the other as Y-mark. X-mark is used for alignment of the wafer 403 in x-direction and Y-mark is used for alignment of the wafer in y-direction. Two separate alignment optical systems are provided for the respective X-mark and Y-mark on the reticle 401. The optical system for X-mark and that for Y-mark are the same in arrangement and operation of which a detailed description has already been made above. Therefore, only the alignment optical system for x-direction will be described briefly hereinafter.

A spotlight 30 of laser beam scans the surface of X-mark through objective lens system 449 and mirror 424. The laser beam reflected by the chrome layer of X-mark is concentrated on a photoelectric element 425. The photoelectric element 425 produces a signal 32a as shown in FIG. 11B. This signal is referred to hereinafter as reticle signal $R_X$. The spotlight 30 transmitted through X-mark enters the projection lens 402 by which the spotlight is projected on the wafer as spotlight 30' to scan the wafer mark. The diffracted light from the wafer mark passes through X-mark again and is branched by a half mirror 458. After cutting off zero-order diffracted light, the branched diffracted light (return light) is concentrated on a photoelectric element 429. The photoelectric element 429 produces a signal 32b as shown in FIGS. 11C and 11D. Hereinafter, this signal is referred to as wafer signal $W_X$.

In a similar manner to the above, photoelectric elements 425 and 429 detect Y-mark on the reticle 401 and the corresponding wafer mark and produce reticle signal $R_Y$ and wafer signal $W_Y$ respectively.

As shown in FIG. 14, signals $R_X$ and $W_X$ are amplified by amplifiers 480 and 481 and then their peak points are detected by signal detectors 482 and 483 to form an alignment signal. The alignment signal is composed of pulse signals Ap, Bp and Wp as shown in FIGS. 11E and 11F. A time measuring instrument 484 measures time $\Delta t_1$ of from pulse signal Bp to pulse signal Wp and time $\Delta t_2$ of from $W_p$ to Ap. Gate signals $S_1$ and $S_2$ proportional to the measured times $\Delta t_1$ and $\Delta t_2$ are put into a counter 486 from the time measuring instrument 484. To obtain these gate signals $S_1$ and $S_2$ there is used a discrimination signal $S_3$ which is proportional to the frequency of the beam scanning oscillating mirror. This discrimination signal $S_3$ may be, for example, such digital signal which rises up and falls down at peak points of the sinusoidal wave scanning. This signal is obtained from a synchronizing circuit 485 to which an oscillating mirror driving signal is applied. By this signal $S_3$, the generation of the pulse signals Ap and Bp in the sequence of Bp→Ap, Ap→Bp and change in time of $\Delta t_1 \rightarrow \Delta t_2$, $\Delta t_2 \rightarrow \Delta t_1$ are discriminated. Timing of above signals is shown in FIG. 15.

The counter 486 counts clock signals based on signal $S_1$ and clock signals based on signal $S_2$ independently of each other and generates count value $C_1$ and $C_2$ in proportion to times $\Delta t_1$ and $\Delta t_2$ respectively. These count values $C_1$ and $C_2$ are introduced into an operator 487 which carry out an operation of $C_1-C_2$ i.e. $\Delta t_1-\Delta t_2$ to produce a signal $\Delta C$ corresponding to the difference between $C_1$ and $C_2$. Consequently, the signal $\Delta C$ is proportional to the existing deviation in position between reticle mark and wafer mark in x-direction.

488 is a stage control circuit which receives the above signal $\Delta C$ as input and drives the driving system 472 shown in FIG. 13 by means of a signal corresponding to the input signal $\Delta C$.

If the signal $\Delta C$ is indicative of not only the amount of deviation but also the direction of deviation by the sign of polarity of the analog signal, then the reticle 401 and the wafer 403 (chip 433) can be automatically aligned with each other in x-direction by the processing system. As previously described, the aimed alignment is attained by moving the stage 470 by the driving system 472 in the direction for $\Delta t_1 = \Delta t_2$ (or $\Delta t_1 - \Delta t_2 \doteq 0$), that is, in the direction for decreasing the signal $\Delta C$ (its absolute value) down under a determined value. In the same manner as above, alignment of the wafer 403 (chip 433) with the reticle 401 in y-direction can be attained by driving the driving system 473 in accordance with signals Ry and Wy.

The operator 487 may be replaced by a computer such as a microcomputer which carries out operational processing using a soft ware.

In the above embodiments, the laser beam scanning has been carried out in the form of a sine wave having a large amplitude to obtain the alignment mark detection signals(function of time) in the near-linear area of the sine wave and also find out the positional relation between the alignment marks in the near-linear area. However, a smaller amplitude also may be used for beam scanning. In this case, as a matter of course, there is produced a problem of non-linearity in sine wave scanning. For example, change in time $\Delta t_1$, $\Delta t_2$ is no longer proportional to change in spotlight scanning position relative to every alignment mark. Some correction is needed in this case. Such correction may be made, for example, by a calculation employing the sine function with soft ware of the operator 487 to rearrange the relation between signal $C_1$, $C_2$ and mark position into a linear one.

It is not always necessary that the time at which the state of the discrimination signal $S_3$ is inverted be the peak point of the sine wave scanning. It is also possible to invert the signal at the oscillating center.

In the above embodiments, signal processing and control for alignment have been performed by detecting the respective positions of alignment marks. However, the alignment control can be performed according to the synchronous detection method when the beam scanning is carried out with a small amplitude and in the form of sine wave. For synchronous detection, the amplitude of beam scanning is made sufficiently small enough to restrict the amplitude of the reticle mark scanning spotlight within the range of reticle mark.

Hereinafter, the method of detecting alignment marks according to the synchronous detection system will be described with reference to FIG. 16. Waveforms shown in FIG. 16 are those obtained when the same reticle mark as the reticle mark 104 in the first embodiment was used. However, the same results will be obtained even when the reticle 204 in the second embodiment is used in stead of the reticle mark 104. In FIG. 16, waveforms are plotted with time as the abscissa.

FIG. 16A shows the scanning waveform of the spotlight 30 (or oscillating mirror). The upper side of the oscillating center m is positive and the under side is negative.

Figure 16B:
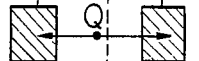
FIGS. 16B to 16D show the relation between the oscillation of spotlight and the reticle mark and the waveforms of the respective photoelectric signals.
Figure 16C:
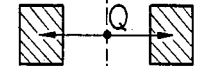
Figure 16D:
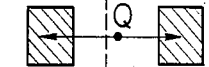

FIGS. 16B, 16C and 16D show the relation between the center Q of the reticle mark 104 and the oscillating center m in different positions and the waveforms of the photoelectric signals obtained from the photoelectric element 125 for the different positions. The photoelectric element 125 receives the light reflected by the chrome layer 104a.

FIGS. 16E, 16F and 16G show the relation between the oscillating center m and the position of the wafer mark 117 in different positions, and also the waveforms of the photoelectric signals obtained from the photoelectric element 129 for the different positions. The photoelectric element 129 receives only high order diffracted lights generated by the wafer mark 117.

In these figures, the arrow indicates the scanning range of spotlight.

In the case of FIG. 16B, the center Q of the reticle mark is deviated leftward, that is, to the positive side of scanning waveform from the oscillating center m. On the contrary, in the case of FIG. 16D, the mark center Q is deviated toward the negative side from the oscillating center m. In FIG. 16C, the mark center Q and the oscillating center m are almost coincident with each other.

In the case of FIG. 16E, the center of the wafer mark 117 is deviated from the oscillating center m leftwards, that is, to the positive side of scanning waveform. On the contrary, in the case of FIG. 16G the mark center is deviated to the negative side of the scanning waveform. In FIG. 16F, the center of the wafer mark 117 and the oscillating center m are almost coincident with each other.

The scanning waveform of the reticle mark scanning spotlight 30 and that of the wafer mark scanning spotlight 30' (not shown) are inverted in phase by the projection lens.

The respective photoelectric signals obtained in the manner described above are independently detected by synchronous detection. Thus, detection output as shown in FIG. 16H is obtained. In FIG. 16H, the detection output is plotted with the amplitude of the output as the ordinate and the deviation from the oscillating center m as the abscissa. For purpose of explanation, the detection output obtained from the photoelectric signal of the photoelectric element 125 is referred to hereinafter as reticle detection signal and the detection output obtained from the photoelectric signal of the element 129 is referred to as wafer detection signal. The reticle detection signal is indicative of the relative position of the center Q of the reticle mark to the oscillating center m. The wafer detection signal is indicative of the relative position of the center of the wafer mark to the oscillating center m. The aimed alignment is attained, therefore, by detecting the zero point of each the detection signal. More concretely, man aligns the center of the reticle mark and the center of the wafer mark with the oscillating center m serving as a reference point. (At first man moves the reticle until the reticle detection signal reaches the zero-point and then moves the wafer until the wafer detection signal reaches the zero point). Alternatively, the alignment can be attained using the center of the reticle mark as a reference point. (For example, a plane parallel glass plate arranged in the scanning optical system is rotated to move the oscillating center m until the reticle detection signal reaches the zero point and then the wafer is moved to the aligned position).

In this manner, according to the invention, TTL automatic alignment of high accuracy and high speed can be realized also by synchronous detection.

For a step-and-repeat type exposure apparatus, the so-called θ rotation correction of wafer is needed in addition to the alignment in two directions x and y by two alignment marks as shown in FIG. 12. For this purpose it is recommendable to provide three reticle marks on the reticle. In this case, on each chip on the wafer there are provided wafer marks corresponding to the reticle marks. Some examples of arrangement of such three reticle marks are shown in FIGS. 17A to 17C.

Figures 17A, 17B, 17C:
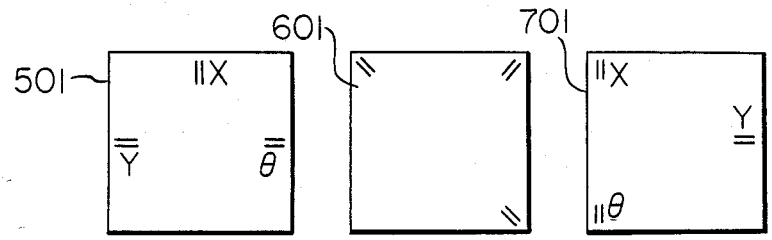
FIGS. 17A to 17C are plan views of reticles in different embodiments.

In FIG. 17A, the reticle 501 has three reticle marks X, Y and θ. The reticle mark θ is one used for detection of θ rotation correction. In this example, the reticle mark Y and the reticle mark θ are arranged in the same line with respect to the longitudinal direction of mark. In another example shown in FIG. 17C, the reticle mark X and the reticle mark θ are arranged in the same line on the reticle 701. In a further example shown in FIG. 17B, the longitudinal lines of three reticle marks extend radiately. Two marks are arranged on the same diagonal line of the reticle 601 and the remaining one on the other diagonal line.

Figure 18:
FIG. 18 shows a modification of the form of diffraction grating of wafer mark or reticle mark and FIG. 19 shows a modification of reticle mark.

The diffraction grating structure of the previously shown wafer mark or of the reticle mark in the third embodiment may be modified as shown in FIG. 18. In this modification, a number of minute line segmental elements constituting one mark are inclined 45° relative to the line along which the elements are arranged in a row. Other inclination angle than 45° may be used. Accordingly to the inclination of the elements, the direction in which light is diffracted by the mark changes. Therefore, this modification has an advantage that the diffracted light by the mark can be distinguished from scattered light and diffracted light by the circuit pattern near the mark.

Figure 19:
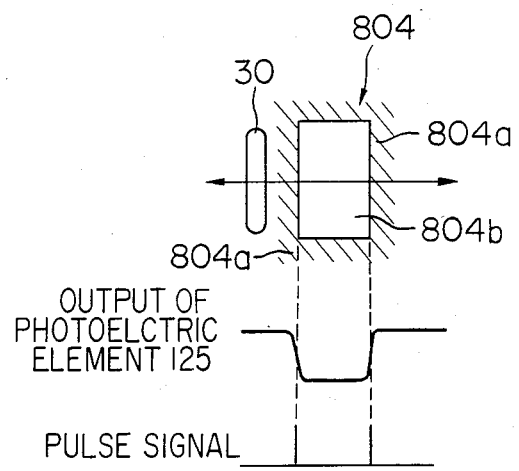

In the first embodiment, the reticle alignment mark 104 has been shown to comprise two slit-like chrome layers and a light transmissive center portions sandwiched in between the two layers. FIG. 19 shows a modification of the reticle mark.

In this modification, the light transmissive center portion is formed as a window-like portion 804b enclosed by a chrome layer 804a. When the spotlight 30 scans such reticle mark 804, the photoelectric element 125 produces a rectangular photoelectric output signal in which the signal level is inverted at the boundary between the center portion 804b and the chrome layer 804a. This photoelectric signal is shaped into a clear rectangular wave by a suitable detection circuit. Pulse signals are generated at the fall-down and rise-up of the rectangular wave. In this case, the processing system described above can be used without any alteration for alignment.

In the embodiments described above, the scanning laser beam has been obtained from He-Cd laser source. Therefore, scanning of the laser spotlight 30' on the wafer means an exposure of photo resist to light. Considering this fact, it is desirable that the alignment mark on wafer lies within the scanning range of the spotlight 30' for alignment of wafer mark with reticle mark. In other words, the reticle and the wafer should be aligned with each other prior to the mark alignment to the extent that the reticle mark and the wafer mark get roughly in alignment with each other. This pre-alignment may be attained, for example, by a separate alignment optical means provided outside of the projection lens. Said separate optical means detects a particular mark provided on the wafer for this pre-alignment of the wafer with the reticle (off-axis alignment).

Usually, one wafer is exposed several times with different reticle patterns to make an integrated circuit chip. Therefore, in the case of positive photo resist, the wafer mark used for TTL step alignment as described in the above embodiments will be removed out by the following development and etching processing. For this reason, a plural number of wafer marks are printed within one chip area at once at the time of the first exposure to the wafer. Also, on each of the reticles there are provided reticles marks at different positions corresponding to the wafer marks.

The alignment apparatus according to the present invention can be applied to other type of exposure apparatus than the shown projection type exposure apparatus. For example, the alignment apparatus of the present invention may be used also in the proximity type exposure apparatus.

As readily understood from the foregoing, the alignment apparatus according to the present invention has many advantages over the prior art ones.

According to the invention, wafer mark and reticle mark are reciprocally scanned by a scanning beam oscillating with a large amplitude. This scanning can be carried out in a very simple manner by use of a galvano mirror or the like. Since information of light produced from every alignment mark is detected while illuminating the mark with the light beam, the detection signals obtained are good in shape and easy to process.

The use of diffraction grating structure of mark, the use of elongate slit-like spotlight of the laser having such wavelength nearly equal to that of the exposure light source and the photoelectric detection of only high order diffracted lights from the diffraction grating structure of the mark are all contributable to improvement of accuracy of mark detection. Consequently, according to the invention, the mark position can be detected very exactly even when the spotlight is scanned at high speed.

Furthermore, the reciprocal scanning of the laser beam by a mirror oscillating in the form of sine wave enables to carry out the signal detection at high speed. For example, it has been found that when the oscillating mirror is driven to oscillate at a frequency in the order of 1 KHz, there is obtained such high signal processing speed in the order of from 20 to 50 m SEC.

While the invention has been particularly shown and described with reference to preferred embodiments thereof, it will be understood by those skilled in the art that the foregoing and other changes and modifications may be made therein departing from the spirit and scope of the invention. The number of alignment marks to be provided may be one on the reticle and one pair on the wafer. Also, many marks may be arranged on the reticle and on the wafer. To all of such modifications the same signal processing as described above may be applied.

We claim:

1. An alignment apparatus for aligning a first substrate and a second substrate, comprising:
    (a) first alignment mark means provided at a predetermined position on said first substrate and having a plurality of short line segments arranged in a stripe pattern extended in a linear direction;
    (b) second alignment mark means provided at a predetermined position on said second substrate and having a plurality of short line segments arranged in a stripe pattern extended in a linear direction;
    (c) scanning means generating a scanning beam which scans said first alignment mark means along a scanning line having a predetermined angle with respect to said linear direction of said first alignment mark means and scans said second alignment mark means along a scanning line having a predetermined angle with respect to said linear direction of said second alignment mark means;
    (d) means for receiving a part of said scanning beam divided by said first and second alignment mark means for form an output showing relative positional relation between said first and second alignment mark means;
    (e) means responsive to said output showing relative positional relation to move at least one of said first and second substrates relative to the other; and
    (f) an image-forming optical system disposed between said first end second substrates for projecting a pattern formed on said first substrate onto said second substrate, said scanning means projecting said scanning beam on said first substrate at a surface facing said image-forming optical system.

2. An alignment apparatus as set forth in claim 1, wherein said scanning beam has a shape elongated in a direction substantially parallel to said first alignment mark means on said first substrate and has a shape elongated in a direction substantially parallel to said second alignment mark means on said second substrate.

3. An alignment apparatus as set forth in claim 1, wherein said receiving means includes a first means receiving a part of said scanning beam from said first alignment mark means and a second means receiving a part of said scanning beam from said second alignment mark means.

4. An alignment apparatus for aligning a first substrate and a second substrate disposed optically conjugated with each other relative to an image-forming optical system, comprising:
    (a) first alignment mark means provided at a predetermined position on said first substrate, said first alignment mark means having a light reflecting area provided on a surface of said first substrate facing said image-forming optical system and a light transparent area surrounded by said light reflecting area, said light transparent area having at least a linear edge;
    (b) second alignment mark means provided at a predetermined position on said second substrate in linear form, said second alignment mark means having a plurality of short line segments arranged in a stripe pattern extended in a linear direction;
    (c) means for projecting a light beam onto said first alignment mark means from a side of said surface of said first substrate and onto said second alignment mark means through said light reflecting area and said image-forming optical system, said light beam having a shape elongated in a direction substantially parallel to said second alignment mark means on said second substrate;
    (d) means for scanning said first alignment mark means by said light beam along a scanning line having a predetermined angle with respect to the longitudinal direction of said light beam on said first substrate and scanning said second alignment mark means by said light beam along a scanning line having a predetermined angle with respect to the longitudinal direction of said light beam on said second substrate;
    (e) first receiving means for photoelectrically detecting the light beam transmitted through said transparent area;
    (f) second receiving means for photoelectrically detecting the light beam diffracted by said second alignment mark means and reflected by said light reflecting area; and
    (g) means responsive to said first and second receiving means to move to least one of said first and second substrate relative to the other.

* * * * *